US012313652B2

(12) United States Patent
McMullen et al.

(10) Patent No.: US 12,313,652 B2
(45) Date of Patent: May 27, 2025

(54) MICROMACHINED MECHANICAL PART AND METHODS OF FABRICATION THEREOF

(71) Applicant: The University Court of the University of Glasgow, Glasgow (GB)

(72) Inventors: Thomas McMullen, Glasgow (GB); Richard Bates, Glasgow (GB)

(73) Assignee: The University Court of the University of Glasgow, Glasgow (GB)

( * ) Notice: Subject to any disclaimer, the term of this patent is extended or adjusted under 35 U.S.C. 154(b) by 139 days.

(21) Appl. No.: 18/014,715

(22) PCT Filed: Jul. 5, 2021

(86) PCT No.: PCT/EP2021/068503
§ 371 (c)(1),
(2) Date: Jan. 5, 2023

(87) PCT Pub. No.: WO2022/008436
PCT Pub. Date: Jan. 13, 2022

(65) Prior Publication Data
US 2023/0296645 A1    Sep. 21, 2023

(30) Foreign Application Priority Data

Jul. 7, 2020  (GB) ..................... 2010407

(51) Int. Cl.
*G01R 1/067* (2006.01)
*C23F 4/00* (2006.01)
*G01R 3/00* (2006.01)

(52) U.S. Cl.
CPC ............ *G01R 1/06744* (2013.01); *C23F 4/00* (2013.01); *G01R 1/06755* (2013.01); *G01R 3/00* (2013.01)

(58) Field of Classification Search
CPC ... G01R 1/00; G01R 1/02; G01R 1/06; G01R 1/067; G01R 1/06711; G01R 1/06733;
(Continued)

(56) References Cited

U.S. PATENT DOCUMENTS

| 5,176,792 A | 1/1993 | Fullowan et al. |
| 5,756,370 A | 5/1998 | Farnworth et al. |

(Continued)

FOREIGN PATENT DOCUMENTS

| CN | 101785085 A | * | 7/2010 | ............ H01L 21/00 |
| CN | 111137840 A |   | 5/2020 | |

(Continued)

OTHER PUBLICATIONS

Daubbenspeck and Sukanek (1990) Development of a chlorofluorocarbon/oxygen reactive ion chemistry for fineline tungsten patterning, Journal a Vacuum Science & Technology B: Processing and Phenomena, 8 (4) 586-595.

(Continued)

*Primary Examiner* — Hoai-An D. Nguyen
(74) *Attorney, Agent, or Firm* — Rudy J. Ng; Bozicevic, Field & Francis LLP

(57) ABSTRACT

The present invention relates primarily to a method of fabrication of one or more free-standing micromachined parts. The method includes performing reactive ion etching of photoresist and tungsten-based layers supported on a carrier substrate to thereby define one or more micromachined parts, followed by separating the resulting one or more micromachined parts from the carrier substrate such that the parts are free-standing. The invention also relates to tungsten-based microprobe obtainable by such a method, wherein the microprobe has a substantially square or rectangular cross-section in a direction perpendicular to a lon- (Continued)

gitudinal axis of the microprobe, and to probe cards comprising a plurality of such microprobes.

20 Claims, 3 Drawing Sheets

(58) Field of Classification Search
CPC .. G01R 1/06744; G01R 1/06755; G01R 3/00; C23F 4/00
USPC ............... 324/500, 537, 756.01, 756.03
See application file for complete search history.

(56) References Cited

U.S. PATENT DOCUMENTS

| | | | |
|---|---|---|---|
| 6,005,288 | A | 12/1999 | Farnworth et al. |
| 8,448,506 | B2 | 5/2013 | Yoon et al. |
| 9,029,238 | B2 | 5/2015 | Andry et al. |
| 9,140,347 | B2 | 9/2015 | Kombowski |
| 9,977,054 | B2 | 5/2018 | Albertson et al. |
| 2004/0226464 | A1 | 11/2004 | Mirkin et al. |
| 2007/0039927 | A1* | 2/2007 | Withers ............... B24B 37/044 438/692 |
| 2014/0283230 | A1 | 9/2014 | Li et al. |
| 2017/0017131 | A1* | 1/2017 | Aoki ................. G02F 1/136259 |
| 2019/0041429 | A1 | 2/2019 | Edwards et al. |
| 2020/0381284 | A1* | 12/2020 | Arnal .................... B41J 2/1628 |

FOREIGN PATENT DOCUMENTS

| | | | | |
|---|---|---|---|---|
| JP | 2005045053 A | * | 2/2005 | ........... H01L 21/205 |
| KR | 100951543 | | 4/2010 | |
| TW | I583395 B | | 5/2017 | |
| TW | I584925 B | | 6/2017 | |
| WO | WO 2005043594 | | 5/2005 | |
| WO | WO2019155518 A1 | | 8/2019 | |

OTHER PUBLICATIONS

Ma et al.; (2016) "Fabrication and characterization of a tungsten microneedle array based on deep reactive ion etching technology," J Vac. Sci. Technol, B34, pp. 052002-052002-7.
Okuyama et al.; (2001) "Microfabrication of thick tungsten films for use as absorbers of deep X-ray lithography masks," Microsystem Technologies, Springer-Verlag, 7, pp. 80-84.
Reyes-Betanzo et al,; (2002) "Study of Conditions for Anisotropic Plasma Etching of Tungsten and Tungsten Nitride Using SF 6 / Ar Gas Mixtures." Journal of the Electrichemical Society, 149(3) G179-G183.
Smith et al.; (2007) "High Temperature-Resistant Spin-On adhesive for Temporary Wafer Mounting Using an Automated High-Throughout Tooling Solution," CS MANTECH Conference, pp. 29-32.
21 739 375.0-1001 EP Examination Report dtd Jun. 2, 2025 1-4 pages.
2023-501272 JP Notice of Reasons for Refusal dtd Feb. 27, 2025 1-4 pages.

* cited by examiner

ND METHODS OF FABRICATION
MICROMACHINED MECHANICAL PART AND METHODS OF FABRICATION THEREOF

FIELD OF THE INVENTION

The present invention relates to micromachined mechanical parts and methods of fabrication thereof. It relates particularly, although not exclusively, to free standing micromachined probes suitable for use in applications such as integrated circuit (IC) testing.

BACKGROUND

Micromachined mechanical parts (generally defined as parts having at least one linear dimension in the range of 1 µm to 100 µm) are useful in a wide range of applications. However, one key application for such parts is as microprobes suitable for use in applications such as integrated circuit (IC) testing. To test an IC, probes are attached to probe cards, which act as an interface between an electronic test system and a semiconductor wafer. The purpose of a probe card is to electrically connect circuits on the wafer to the test system. This permits testing and validation of the circuits at the wafer level.

There is an increasing demand for probe cards having finer probe pitches and higher manufacturing precision, because this allows an increase in the number of testable devices per wafer at reduced costs, and furthermore allows for increased I/O test pads on a single device, thereby allowing for more detailed testing. Furthermore, new IC technologies require increased probe performance in the radio frequency (RF) band and high current carrying capabilities (CCC).

Some work has been done to produce small-scale probes in an attempt to solve some of these problems. For example, WO2005043594 discloses two different methods for forming photo-defined micro electrical contacts. A first method includes forming probes from thin Beryllium-Copper flat stock. Respective layers of photoresist are deposited directly onto the opposing surfaces of a planar CuBe alloy sheet. The photoresist layers are then photo-exposed (using a mask) and developed, so that a positive image of a plurality of probes is provided by the remaining photoresist on each surface of the alloy. Each surface is then chemically (wet) etched, so as to form a plurality of probes in the CuBe alloy. This technique makes use of "undercutting" which results from the wet etch process, in order to produce the cross-sectional profile shown in FIG. 10. A second method is also disclosed, in which a negative image of a plurality of probes is formed on a stainless steel mandrel using a photoresist and mask. Ni, or NiCo alloy, is then plated onto the exposed regions of the steel mandrel using electroforming techniques, thereby forming a plurality of Ni or NiCo probes on the exposed surfaces of the mandrel. Neither of these methods are appropriate for forming of tungsten into microprobes. Furthermore, the first method requires careful alignment of masks on opposing surfaces of a planar CuBe sheet. The shape tolerance of the resulting microprobes must therefore be large, due to the difficulty of precisely aligning two sets of masks.

However, the material from which the micromachined part is made is important for many applications. For use as a microprobe, tungsten has many unique properties. For example, tungsten has a high electrical conductivity, which reduces resistive losses when used as a microprobe and therefore reduces probe self-heating (Joule heating). This allows a higher current to be passed through for a given probe design. Additionally, tungsten has a high melting point which allows the probe to operate at a higher temperature. Finally, tungsten is hard which reduces wear of the probe needle and therefore extends its lifetime over other materials.

However, a significant problem to overcome is that it has not previously been possible to reliably produce fine pitch microprobes (or other similarly-sized micromachined parts) from tungsten using conventional prior art methods. Three main technologies exist to make such products:

a. Wire drawing—whilst it is possible to use wire drawing to produce tungsten-based parts, the reproducibility of the part shape is poor, and the manufacturing cost is high;

b. Stamping—the minimum size of the part that can be made is limited, and of the order of 100 micrometres part width. This size is not suitable for many micromechanical applications (and in the case of microprobes, is not suitable for fine pitch applications;

c. Electroplating—whilst electroplating can give good geometric size control, Tungsten cannot be electroplated. Therefore, this process is only suitable for more easily electroplatable materials, such as nickel or palladium alloys (as in WO2005043594, discussed above). These materials have inferior properties compared to tungsten.

Whilst some work has been done on use of deep reactive ion etching to produce tungsten microneedles (see Shenglin et al. (2016)—Reference 1), this process suffers a number of problems. Firstly, in this process, deep reactive ion etching is used to deep etch bulk tungsten to form an array of upstanding members (microneedles). The length of the each of the microneedles is governed by the etch depth. In this way, the microneedles are necessarily attached as extensions of a bulk material. It is not possible to separate the resulting microneedles from the bulk tungsten base to provide stand-alone single microneedles. Accordingly, using this method it is not possible to produce free-standing micromachined parts. Furthermore, this process uses a hard aluminium mask to define the shape of the microneedle array, which can suffer a problem of Al re-deposition during the DRIE process, thereby not making it suitable for mass production of parts. Finally, the resulting microneedles are described as having sidewall tilt angle of approximately 14°. It is therefore not possible to produce parts having vertical or near-vertical sidewalls, as is required (or advantageous) for some applications of micromachined parts.

The present invention has been devised in light of the above considerations.

SUMMARY OF THE INVENTION

The present inventors have realised that some or all of the above problem can be reduced or eliminated by the use of reactive ion etching of tungsten layers in the fabrication of micromachined parts.

Accordingly in a first aspect, the present invention provides a method of fabrication of one or more free-standing micromachined parts comprising steps of:

providing a tungsten-based layer supported on a carrier substrate;

applying a photoresist, exposing the photoresist to light via a mask having a predetermined shape, and removing a portion of the photoresist to thereby provide a photoresist mask on or above the tungsten-based layer;

performing reactive ion etching of the photoresist and tungsten-based layers to thereby define one or more micromachined parts; and separating the one or more micromachined parts from the carrier substrate.

The term 'tungsten-based layer' is used herein to define a layer which comprises, consists essentially of, or consists of tungsten (W). Preferably, tungsten is present in the layer at an atomic % of 50 at % or more. In other words, tungsten is preferably the major component of the tungsten-based layer. Tungsten may be present in the layer at an atomic % of 60 at % or more, 70 at % or more, 80 at % or more, 90 at % or more, 95 at % or more, or 99 at % or more. Optionally, one or more other elements may be present. For example, the tungsten-based layer may be a tungsten-based alloy, such as a tungsten-rhenium alloy (W—Re alloy). Use of a W—Re alloy layer may be particularly advantageous in certain applications of the method of the present invention, in particular for the manufacture of microprobes. W—Re microprobes show reduced contact resistance over time in comparison to pure W microprobes, due to a lower oxidation of the tip, although the bulk electrical conductivity may be slightly reduced in comparison to a pure W microprobe. Where the tungsten-based layer is a W—Re alloy, Re may be present in an amount from about 1 at % to about 10 at %, more preferably in a range of about 3 at % to about 5 at %. At such atomic percentages, Re is present in solid solution in W.

Reactive ion etching (RIE) is a dry etching technology, in which a chemically reactive plasma is used to remove material from the layer to be etched. This chemically active plasma is generated under low pressure (vacuum) by an electromagnetic field, and high-energy ions from the plasma attack the material surface and react with it. RIE, as a dry etching technology, has different characteristics as compared to wet etching technologies. In particular, due to the mostly vertical delivery of reactive ions, reactive-ion etching can produce very anisotropic etch profiles, in contrast to typically isotropic profiles produced as a result of wet chemical etching technologies.

The present inventors have found that by using RIE to etch tungsten, it is possible to produce free-standing micromachined parts at a relatively high scale, and at a relatively low cost per part. Furthermore, use of RIE allows for production of micromachined parts with lithographic precision, and allows for fine-scale part detail at sub-micrometre accuracy (for example, where the micromachined parts are microprobes, fine probe pitch, and near-vertical probe sidewalls) as compared with existing technologies used for micromachining of tungsten. The present invention allows for fabrication of tungsten-based parts with a level of precision not possible using existing technologies (such as wire extrusion or sheet stamping processes discussed in the 'background' section above). The term 'free-standing' is generally used in the present disclosure to define a part that is not required to be attached to or supported by another structure, although in practical use, such parts may well be attached to or supported by another structure. This is in comparison to non-free-standing parts, which are parts that, either due to their method of manufacture, or lack of ability to support their own weight, must always be connected to or supported by another structure. It will be understood that whilst micromachined parts according to the present invention are initially produced as free-standing parts, in subsequent use they may be attached to or supported by one or more other components.

The tungsten-based layer may be provided as a foil layer. The term 'foil layer' is here used to refer to a layer which is formed as a thin, free-standing metal sheet, typically fabricated by hammering or rolling (although other fabrication methods are possible). The thickness of a foil layer may be e.g. in a range of 1 µm to 100 µm, more preferably in a range of 5 µm to 50 µm. A foil layer may be provided as an initially-free-standing layer which is transferred to the carrier substrate to be supported on the carrier substrate. In other words, a foil layer may not be deposited directly onto the carrier substrate. Alternatively, the tungsten-based layer may be provided as a deposited layer, optionally directly deposited on the carrier substrate by a process such as chemical vapour deposition (CVD).

Providing the tungsten-based layer as a foil layer may be more preferable that providing the tungsten-based layer as a deposited layer. Providing the tungsten-based layer as a foil layer has a number of advantages over use of a deposited tungsten-based layer, including increased manufacturing efficiency by reduction in processing time and complexity, and reducing processing cost. Use of a foil tungsten-based layer may furthermore allow for greater control of the layer thickness, and may, as a result, allow for greater reproducibility of part thickness, thereby allowing production of a plurality of micromachined parts wherein the respective thicknesses of the parts substantially do not vary, or vary by an insignificant amount (for example they may vary by no more than 1 µm with respect to any other one of the plurality of micromachined parts).

The method may comprise a step of polishing the tungsten-based layer. Polishing may be performed on one or both faces of the tungsten-based layer. Where the tungsten-based layer is provided initially as a free-standing layer (for example, as a foil layer), polishing of one or both faces (a face here being defined as a major surface of the layer) of the tungsten-based layer may be performed prior to the tungsten-based layer being supported on the carrier substrate. Alternatively, polishing of one face of the layer (the free face) may be performed 'in-situ' whilst the tungsten-based layer is supported on the carrier substrate.

A polishing step may be particularly advantageous where the tungsten-based layer is provided as a foil layer, due to the tendency for high roughness of foil layer resulting from the manufacturing process, although may also be advantageous regardless of the form of the tungsten-based layer. For example, a rolled tungsten foil may have an initial arithmetic average roughness, $R_a$, of order 100 nm and a max peak-to-trough, $R_t$ greater than 1 µm. This roughness may present issues in further process steps, and additionally or alternatively may affect the mechanical and electrical performance of the resulting micromachined part. Polishing the tungsten-based layers can reduce or avoid such problems.

The polishing step may include one or more different polishing sub-steps including one or both of a grinding step and/or a Chemical Mechanical Polishing (CMP) step. In a preferred method, the tungsten-based layer may first be subject to a grinding step to remove the bulk of the roughness, before being polished using a Chemical Mechanical Polishing (CMP) step. One or both major surfaces of the tungsten-based layer may be polished to a surface roughness of $R_a$ of 5 nm or less, and/or $R_t$ of 50 nm or less. In some cases, the major surface(s) of the tungsten-based layer may be polished to a surface roughness as low as $R_a$ of 0.1 nm or less, and/or $R_t$ of 1 nm or less. The surface roughness may be measured using any conventional technique known in the art, for example using atomic force microscopy (AFM), non-contact optical profilometry, or contact profilometry.

Here, the surface roughness is defined with respect to the polished surfaces of the layer. Typically, the polished surfaces will be one or both major faces of the layer. Providing a layer with surface roughness in the above ranges can reduce the risk of manufacturing defects during further processing.

The final thickness of the micromachined parts produced according to the method can be in part determined by the thickness of the tungsten-based layer after polishing. Accordingly, the method may include polishing the tungsten-based layer to achieve a predetermined thickness.

The final thickness of the micromachined parts is determined by the thickness of the tungsten-based layer prior to the step of performing reactive ion etching of the photoresist and tungsten-based layers (and where polishing is performed, after polishing). The thickness of this layer is not particularly limited, although the thickness prior to the step of performing reactive ion etching of the photoresist and tungsten-based layers may be 5 μm or more, to provide a free-standing part suitable for use in many microelectromechanical systems (MEMS).

The material of the carrier substrate is not particularly limited, although preferably the carrier substrate comprises a material having a thermal expansion coefficient, CTE, which is within a range of ±10% of the CTE of the tungsten-based layer. One suitable material for the carrier substrate is glass. An alternative material is silicon. Preferably the carrier substrate is transparent or translucent. This can allow for greater ease in manufacturing as manufacturing steps requiring light transmission through the carrier substrate can be used.

The tungsten-based layer may be bonded to the carrier substrate, as well as being supported on it, for example, by means of a suitable adhesive. Bonding the tungsten-based layer to the carrier substrate may increase the ease of handling of the tungsten-based layer and allow processing using a wider range of processing techniques. Where an adhesive is used to bond the tungsten-based layer to the carrier substrate, preferably the adhesive has a thermal expansion coefficient, CTE, which is within a range of ±10% of the CTE of the tungsten-based layer. Examples of suitable adhesives include BrewerBOND® 220 and WaferBOND® HT-10.11, although any suitable bonding material can be used. Where used, the adhesive should be a temporary adhesive to allow for subsequent separation of the micromachined parts from the carrier substrate. Optionally the adhesive layer may consist of or comprise a release layer, e.g. a UV release layer.

By providing a carrier substrate and/or an adhesive having a thermal expansion coefficient, CTE, which is within a range of ±10% of the CTE of the tungsten-based layer, it is possible to reduce or avoid stresses in the tungsten-based layer arising due to heating during the reactive ion etching step. Preferably the thermal conductivity of the carrier substrate and/or adhesive are also high, to allow for thermal transfer away from the tungsten-based layer to the adhesive and/or carrier substrate during etching. For example, a substrate and adhesive combination layer may have a thermal conductivity of 0.8 to 1.4 $Wm^{-1}K^{-1}$ at 90° C. This can help to reduce the maximum temperature reaching in the tungsten-based layer during etching, as too high a temperature may result in unwanted effects on the microstructure of the tungsten-based layer. Preferably the carrier substrate and/or adhesive are thermally stable at temperatures at least up to 130° C., to prevent degradation of these materials during high temperature processing steps.

Conventional photolithographic techniques may be used for the formation of the photoresist mask. The photoresist may be applied on or above a surface of the tungsten-based layer. That is, the photoresist may be applied directly on the tungsten-based layer. Where the photoresist is formed directly on the tungsten-based layer, the step of removing a portion of the photoresist may expose at least part of the tungsten-based layer. Alternatively or additionally, one or more intermediate layers may be provided on the tungsten-based layer, and the photoresist may be applied directly on such an intermediate layer. In this sense, the term "above" is used here to refer to a direction or order of layer deposition, and not necessarily to an orientational relationship of the layers. The photoresist may be applied to cover at only a part of the tungsten-based layer. Alternatively, the photoresist may be applied to cover the entirety of the tungsten-based layer. The photoresist may be applied at a predetermined thickness, selected based on the initial thickness of the tungsten-based layer, and the etch selectivity. This allows for full etching of the foil without etching through the resist mask. For example, where the tungsten-based layer is a thickness of 28 μm, and the etch selectivity is 7:1, the photoresist should be applied at a thickness of greater than 4 μm, to allow for full etching of the foil without etching through the resist mask.

Use of a photoresist mask (sometimes referred to as a 'soft' mask) rather than a 'hard' mask (e.g. such as an aluminium mask) offers advantages in terms of reduced risk of re-deposition of the mask material during the reactive ion etching process, ensuring greater applicability of the method in mass-production of parts.

The photoresist may be either a positive photoresist, or a negative photoresist. Where the photoresist is a positive photoresist, the predetermined shape of the mask will substantially correspond to the intended shape of the one or more free-standing micromachined parts. Where the photoresist is a negative photoresist, and the predetermined shape of the mask will substantially correspond to a negative image of the intended shape of one or more free-standing micromachined parts. In this way, appropriately-shaped part can be formed.

The reactive ion etching may be performed using any suitable plasma, for example $SF_6$ $CF_4$, $Cl_2$, HBr, $O_2$, $H_2$ and/or $CH_4$ [References 1,2,3]. Preferably, the reactive ion etching is performing using sulphur hexafluoride, $SF_6$, plasma. Tungsten can be etched in $SF_6$ plasma by the following reaction (1):

$$W + SF_6 \rightarrow WF_6 + S \tag{1}$$

The by-products of the reaction are tungsten hexafluoride ($WF_6$) and sulphur. $WF_6$ has a low boiling point of 17.1° C. Preferably, the reactive ion etching is performed at a temperature of greater than 17.1° C. Where the RIE is performed at a temperature higher than 17.1° C., the $WF_6$ by-product of the etching is immediately gaseous, and can be exhausted from the etching apparatus without causing issues of metal deposition on the etch chamber ceramics which can result when etching is performed using different materials or at a lower temperature.

Rhenium can be etched in $SF_6$ plasma by the following reaction (2):

$$Re + SF_6 \rightarrow ReF_6 + S \tag{2}$$

Whilst $ReF_4$ and $ReF_5$ may also form, $ReF_6$ is the predominant by-product, and has a boiling point of 33.7° C. Where the tungsten-based layer is a W—Re layer, preferably, the reactive ion etching is performed at a temperature of greater than 33.7° C. This allows for both $WF_6$ and $ReF_6$ by-products to be easily exhausted from the etching apparatus, as they will be immediately gaseous upon etching.

The reactive ion etching may use a Bosch process (also known as pulsed or time-multiplexed etching). That is, the reactive ion etching step may comprise sub-steps of performing alternating etching and passivation steps. As discussed above, sulphur hexafluoride ($SF_6$) or any other suitable gas may be used for the etching step. The passivation step includes deposition of a chemically inert passivation layer and may be performed using a gas such as octafluorocyclobutane ($C_4F_8$). Each of the etching and passivation steps are performed for respective predetermined lengths of time, in an alternating manner, for a predetermined number of cycles. The relative time periods for the etching and passivation steps will affect the resulting etch shape. Generally, a shorter cycle time will yield smoother etch walls with reduced scalloping, and a longer etch time will yield a higher etch rate. The present inventors have found that providing alternating etch and passivation steps with an etch duration in a range of 1 s to 5 s, and a passivation duration in a range of 0.005 s to 0.1 s can provide suitable steep and smooth side walls for the micromachined parts. The present inventors have found that operating with alternating etch and passivation steps of about 3.5 s and about 0.01 s respectively gives a good balance between etch speed and reduced scalloping of side walls.

Once RIE etching to define the micromachined parts is complete, any residual photoresist may be removed from the tungsten-based layer. This may be removed by any suitable process. In methods where the tungsten-based layer is bonded to the carrier substrate, and resist stripper should be selected so that it does not react with the bonding adhesive to cause premature debonding of the micromechanical parts. In one suitable method, the carrier substrate and tungsten-based layer may be immersed in a resist stripper such as 1-Methyl-2-pyrrolidon (NMP) at a temperature of around 90° C. for about 5 minutes, before being rinsed in de-ionized water for about 5 min.

The step of separating the one or more micromachined parts from the carrier substrate may include a number of sub-steps. The sub steps may comprise:
bonding a free surface of the one or more micromachined parts to a releasable tape;
separating the micromachined parts from the carrier substrate; and
releasing the micromachined parts from the releasable tape to provide the free-standing micromachined parts.

Where the tungsten-based layer is initially bonded to the carrier layer using a bonding adhesive, the step of separating the micromachined parts from the carrier substrate may include debonding of the micromachined parts from the carrier substrate. Such debonding may be performed by any suitable process. The debonding may be laser-assisted. After debonding, and residual bonding adhesive may be removed in a cleaning step.

The present inventors have found that attaching the micromachined parts to a releasable tape before separating them from the carrier substrate allows for greater ease of handing of the micromachined parts. Furthermore, it is possible to maintain relative alignment between respective parts in a plurality of micromachined parts. The releasable tape may be a UV-release dicing tape. Correspondingly, the step of releasing the micromachined parts from the tape may include exposing the releasable tape to UV light. Examples of suitable dicing tapes include Nitto PF-02 or Lintec D-511T. Preferably the tapes are UV curable so as not to leave adhesive on the final product when they are removed from the dicing tape.

The one or more free-standing micromachined parts produced using the method of the first aspect are not particularly limited in size, shape or purpose. The present inventors have found that this method may be particularly suited for the fabrication of microprobes suitable for use in integrated circuit (IC) testing, however, this method may also be applicable to production of micromachined parts including but not limited to: cogs for use in e.g. watches or drones; micromachined medical tools; and X-ray masks (collimators) for use in e.g. silicon processing or X-ray imaging techniques.

Accordingly, in a second aspect, the present invention provides a micromachined part obtainable by, or obtained by, the method of the first aspect, wherein the micromachined part has a substantially square or rectangular cross-section, in a direction perpendicular to a longitudinal axis of the micromachined parts. Preferably, the micromachined part is a microprobe.

The term 'substantially square' is used herein to define that the sidewalls of the micromachined part or microprobe are substantially vertical, and the major faces of the micromachined part or microprobe are substantially horizontal. In other words, preferably the sidewalls of the micromachined part or microprobe extend at an angle of about 90° with respect to the major faces of the micromachined part or microprobe. There may be slight variation in this due to manufacturing tolerances, but preferably the sidewalls of the of the micromachined part or microprobe extend at an angle of between 88° and 92° with respect to the major faces of the micromachined part or microprobe, more preferably at an angle of between 89° and 91° with respect to the major faces of the micromachined part or microprobe.

Where the micromachined part is a microprobe, the microprobe may have a width of less than 1 mm. The precise width is not particularly limited, and may be selected as appropriate for the desired commercial application. In some preferred arrangements, the width of the microprobe is 25 µm or less, 10 µm or less or 5 µm or less. The length of the microprobe is not limited, other than by the dimensions of the initial tungsten-based layer. However, the length of the microprobe may be in a range from as low as 10 µm up to 10 mm. The length of the microprobe may be 50 µm or more, 100 µm or more, 500 µm or more, 1 mm or more or 2 mm or more. For most applications, the microprobe length may be selected to be in a range of 2 mm to 10 mm.

At least one surface of the tungsten-based microprobe may have a surface arithmetic average roughness, $R_a$, of 5 nm or less, more preferably as low as 1 nm or less. Preferably at least two opposing faces of the tungsten-based microprobe have a surface arithmetic average roughness, $R_a$, of 5 nm or less, more preferably as low as 1 nm or less.

In a third aspect, the present invention provides a plurality of tungsten-based microprobes according to the second aspect, wherein the respective thickness of each of the plurality of microprobes varies by no more than 1 µm with respect to any other one of the plurality of microprobes. This uniformity in thickness across a plurality of microprobes has the technical advantage that in use (e.g. as part of a probe card), the required overdrive/force to make electrical contact is approximately equal for all microprobes. This results in a more reproducible measurement, and an increase in usage lifetime of a device incorporating the plurality of microprobes, as no one microprobe is over-stressed during use. The plurality of tungsten-based microprobes may be produced by a method according to the first aspect, where the tungsten-based layer is provided as a foil layer. As the thickness of the foil substantially determines the thickness of the resulting micromachined parts, it is therefore possible to reduce or eliminate variation in thickness across a plurality of parts produced from the same foil layer.

In a fourth aspect, the present invention provides a probe card comprising a plurality of tungsten-based microprobes according to the second or third aspect, wherein the pitch of the plurality of microprobes is 45 µm or less, the pitch being defined as the distance between centres of two neighbouring microprobes in a direction perpendicular to a longitudinal axis of the microprobes. The pitch is typically equal to the total width of a single microprobe plus the width of a gap between adjacent microprobes. The width of the microprobes may from 25 µm or less, for example 10 µm or less, down to about 5 µm. The width of a gap between adjacent microprobes is not particularly limited, although may be between e.g. 10 µm and 20 µm. The pitch of the plurality of tungsten-based microprobes may therefore be 45 µm or less, as low as about 15 µm.

The probe card may be manufactured in a conventional manner using a plurality of tungsten-based microprobes according to the second or third aspects.

The invention includes the combination of the aspects and preferred features described except where such a combination is clearly impermissible or expressly avoided.

SUMMARY OF THE FIGURES

Embodiments and experiments illustrating the principles of the invention will now be discussed with reference to the accompanying figures in which.

DETAILED DESCRIPTION OF THE INVENTION

Aspects and embodiments of the present invention will now be discussed with reference to the accompanying figures. Further aspects and embodiments will be apparent to those skilled in the art. All documents mentioned in this text are incorporated herein by reference.

Figure 1:
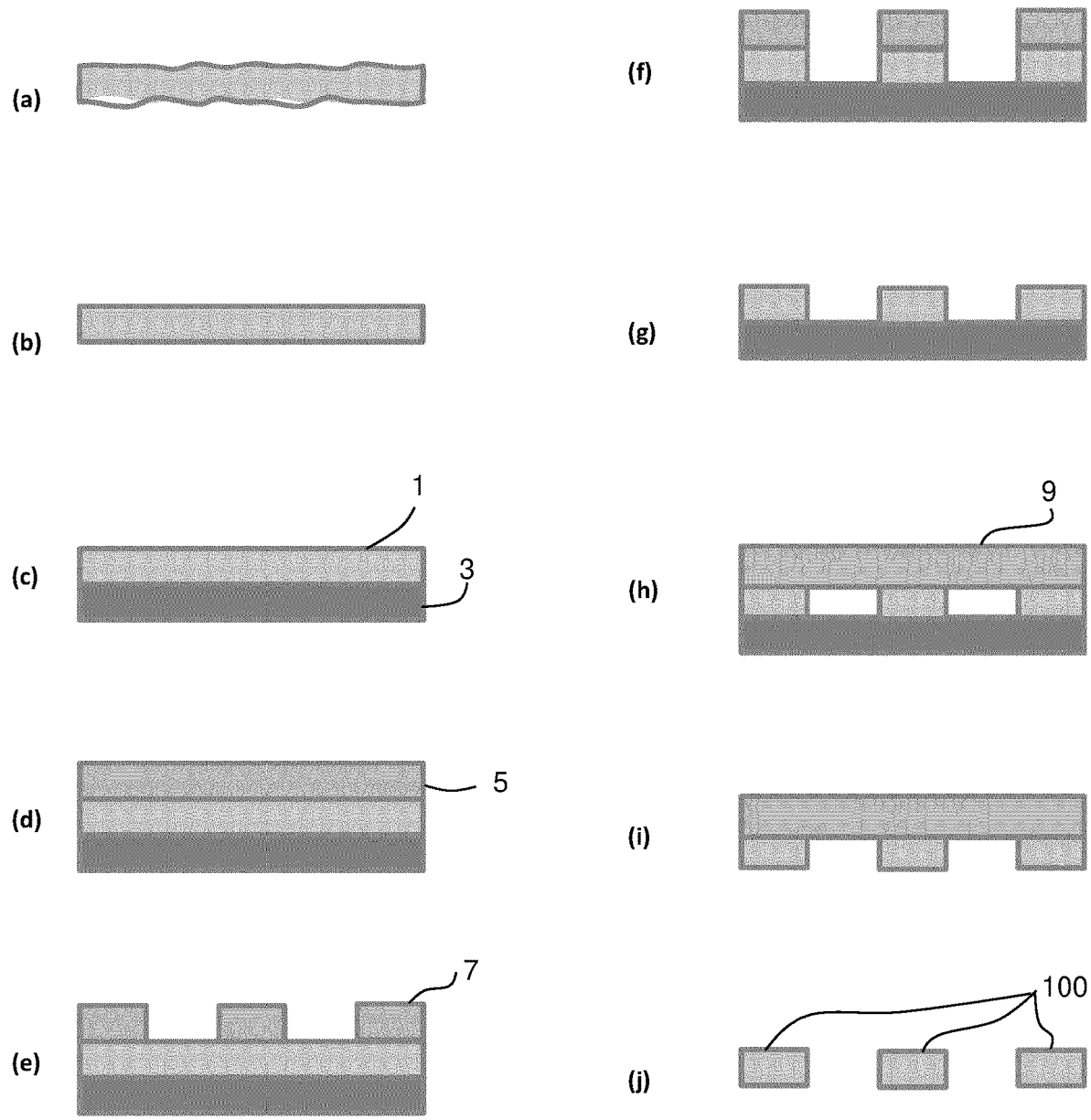
FIG. 1 shows schematically a series of process steps in a method according to the present invention.

FIG. 1 shows schematically a series of process steps in one example of a method according to the present invention. It will be understood that the method is not limited to the precise steps show here, and modifications to this method may be made as set out in the 'summary of invention' section above. The steps in the depicted method can be summarised as follows:
  a) Step 1: Provide tungsten-based layer, here provided as a tungsten foil of desired dimensions;
  b) Step 2: Polish the tungsten foil on both faces;
  c) Step 3: Bond the tungsten foil to a carrier substrate (here, a glass carrier wafer) to provide a tungsten-based layer supported on a carrier substrate;
  d) Step 4: Apply a photoresist onto the tungsten-based layer;
  e) Step 5: Expose the photoresist to light via a mask having a predetermined shape, and remove a portion of the photoresist to thereby provide a photoresist mask on or above the tungsten-based layer;
  f) Step 6: Perform RIE etching to define micromachined parts;
  g) Step 7: Remove residual photoresist;
  h) Step 8: Temporarily bond a free surface of the micromachined parts to a releasable tape;
  i) Step 9: Separate the micromachined parts from the carrier substrate; and
  j) Step 10: Release the micromachined parts from the releasable tape to provide the free-standing micromachined parts.

One example method is described in more detail below. In this example method, a plurality of microprobes are manufactured from rolled tungsten foils. The electrical and mechanical characteristics of the resulting microprobes (also referred to as probe needles) are substantially determined by the characteristics of the initial tungsten foil.

The present inventors have found that tungsten foils fabricated using a rolled manufacturing process can give the resulting micromachined part high electrical conductivity and mechanical strength. For convenience of manufacturing, the foils are initially cut into circles with diameters compatible with future processing steps; for example, these can be 100 mm or 150 mm diameters. The thickness of the foil is selected to be close to, but larger than, the desired final thickness of the probe needle. [FIG. 1(a) Step 1].

Due to the nature of the rolled tungsten manufacturing process the foil used in this example is rough, with an arithmetic average roughness, $R_a$, of order 100 nanometre and a max peak-to-trough, $R_t$ greater than 1 µm. This roughness may affect the mechanical and electrical performance of the final probe needles, and so a polishing step is performed. [FIG. 1(b) Step 1]. The foil is first ground to remove the bulk of the roughness and then polished using Chemical Mechanical Polishing (CMP). These process steps are applied to both faces of the tungsten foil. The required surface finish of the polished foil in this example is an $R_a$ of 5 nanometres or lower with an $R_t$ of 50 nanometres of lower. The final probe needle's surface finished on two sides is given by that obtained for the polished foil. The thickness of the foil after polishing is the final thickness of the probe needles.

After polishing, the tungsten foil is then temporarily bonded to a glass wafer using a thermally compatible temporary bonding adhesive (such as BrewerBOND® 220, WaferBOND® HT-10.11, or another suitable adhesive). The adhesive layer can also include a release layer for subsequent UVB-laser debonding if this debonding method is chosen. [FIG. 1(c) Step 3] [Reference 4]. As discussed above, appropriate selection of the thermal properties of the adhesive helps to ensure thermal equilibrium between the glass wafer and the tungsten foil at the etch step. Appropriate selection of the thermal properties of the carrier and adhesive can reduce the maximum temperature of the foil during etching (via high thermal conductivity) and can further reduces stress in the foil at elevated temperatures.

A UV sensitive positive photoresist is applied to the temporary bonded tungsten foil [FIG. 1(d) Step 4]. One example of a suitable photoresist is a Megaposit™ SPR220 series resist, obtainable from Dow Chemicals company, although any other suitable photoresist may be used.

The resist thickness is 12 um after coating and is then allowed to relax for 1 hour or more. This can help to reduce or avoid stress-induced cracking of the resist. The resist is then soft baked to bake out the solvents, by gradually increasing the temperature from room temperature (about 20° C.) to about 115° C. over a time period of about 5 minutes, and then holding at the high temperature (about 115° C.) for about 5 minutes. Gradually increasing the temperature can help to avoid the generation of stresses in the foil.

The resist is then exposed through a mask by UV irradiation. In one example, the resist is then exposed through a mask by UV irradiation with an energy of 122 mJ/cm$^2$±10%. This is the product of the lamp power and the time of exposure. The energy used defines the resolution, adhesion and depth of exposure. The precise energy used for exposure of the photoresist can be appropriately selected based on the resist used, its thickness and the required resolution of the mask.

After exposure, the wafer is left to rest for 45 minutes or more. This allows moisture to be reabsorbed from the environment to help complete the polymer cross-linking in the resist. A post-exposure bake is then conducted to complete the cross-linking process in the resist. This bake step is conducted by increasing the temperature from room temperature (about 20° C.) to about 115° C. over a time period of about 5 minutes and subsequently holding the temperature at about 115° C. for 90 seconds. The resist is then developed in a chemically reactive solution (for example, Megaposit™ MF-26A developer) to remove the exposed photoresist leaving behind the photo-polymer resist mask [FIG. 1(e) Step 5].

The tungsten foils are then etched using a PlasmaTherm DSE multiplex inductive coupled plasma machine (although other etching apparatus may be used). This apparatus was selected for this example due to the ability for fast gas switching, fast and stable pressure control and a solid-state RF tuning. The coil around the etching chamber is used to create plasma, while the platen coil is connected to the wafer electrode to control the RF bias potential of the wafer with respect to the plasma. Backside helium pressurization is used to provide heat transfer between the tungsten foil, through the temporary bonding material and carrier wafer to the electrode thus maintaining a constant wafer temperature. When the wafer is placed in the machine, it is clamped by a ceramic ring to the electrode. Alternate etch and passivation steps of 3.5 s and 0.01 s are used. Such fast switching steps avoid side-wall damage by over etching inducing scalloping and allow the formation of substantially vertical sidewalls during the etching process.

The gas used for the etching process is $SF_6$, while the gas used for passivation is $C_4F_8$. The flow rates of the $SF_6$ and $C_4F_8$ are 350 standard cubic centimetres per minute (sccm) and 100 sccm respectively. For the deposition (passivation stage), the pressure in the chamber is 35 mTorr, the platen power is 100 W, and the coil power is 2000 W. For the etch stage the pressure in the chamber is 150 mTorr, the platen power is 150 W, and the coil power is 3000 W.

The RIE has an approximate etch rate of 750 nm/min using these process parameters, for a tungsten foil layer. The required etching time is therefore approximately 34 mins for a 25 μm tungsten foil thickness. In this example, the choice of the material and etch process results in an etch selectivity of tungsten to resist of approximately 7:1 [FIG. 1(f) Step 6]

After etching the wafer, the microstructures on the wafer were examined using an optical microscope and the step height measured using a profilometer. Subsequently, the photoresist mask of the tungsten microstructures was stripped by immersing the wafer in a resist stripper such at NMP at a temperature of 90° C. and rinsed in de-ionized water for 5 min each respectively. NMP was selected as the stripper as it does not react with the temporary bonding agent used to attach the tungsten foil to the glass carrier wafer. [FIG. 1(g) Step 7]

The etched microstructures then undergo a series of electrical test to extract the foil properties prior to debonding. In one example, a 4-point probe resistance measurement of the etched foil was taken to calculate the electrical resistivity of the tungsten-based layer. The sheet resistance was found to be about 5.4 μΩ·cm.

Finally, the microprobes are separated from the carrier substrate. To perform this separation, the free faces of the microprobes are bonded to a UV-release dicing tape [FIG. 1(h) Step 8] [Reference 5], before separating the microprobes from the glass carrier wafer [FIG. 1(i) Step 9].

In examples where the adhesive layer bonding the tungsten-based layer to the carrier substrate includes a release layer for subsequent UV-laser debonding, UV light is shone through the transparent glass carrier substrate and is absorbed in the adhesive release layer. The absorbed UV laser energy breaks the chemical bonds in the adhesive or release layer without generating any substantial heat, and therefore allows for removal of the micromachined parts from the carrier substrate within minimal or no added thermal stress. The UV light does not penetrate with enough intensity to cause the bonding of the micromachined parts to the UV-release dicing tape to be affected. After the laser de-bonding of the micromachined parts and the carrier substrate, the micromachined parts and the carrier substrate can be separated with close to zero mechanical force on the micromachined parts.

The UV-release dicing tape is selected to be UV-curable, and to have a sufficiently high adhesion strength to allow solvent cleaning of the micromachined parts attached to the dicing tape, after separation from the carrier substrate. Examples of suitable dicing tapes are Nitto PF-02 or Lintec D-511T, which have adhesion strengths of 1840 mN/22 mm and 11800 mN/25 mm respectively.

The microprobes are then cleaned whilst mounted on the dicing tape to remove any residual bonding adhesive with either solvent or plasma or a combination there of. Suitable solvents include Mesitylene with IPA or Mesitylene with Methyl-ethyl-ketone.

Finally, the probes are then released from the UV-release dicing tape using ultraviolet radiation (UV), are picked from the tape, and packaged appropriately. This step may be performed by a pick and place tool as appropriate. [FIG. 1(j) Step 10].

Figure 2:
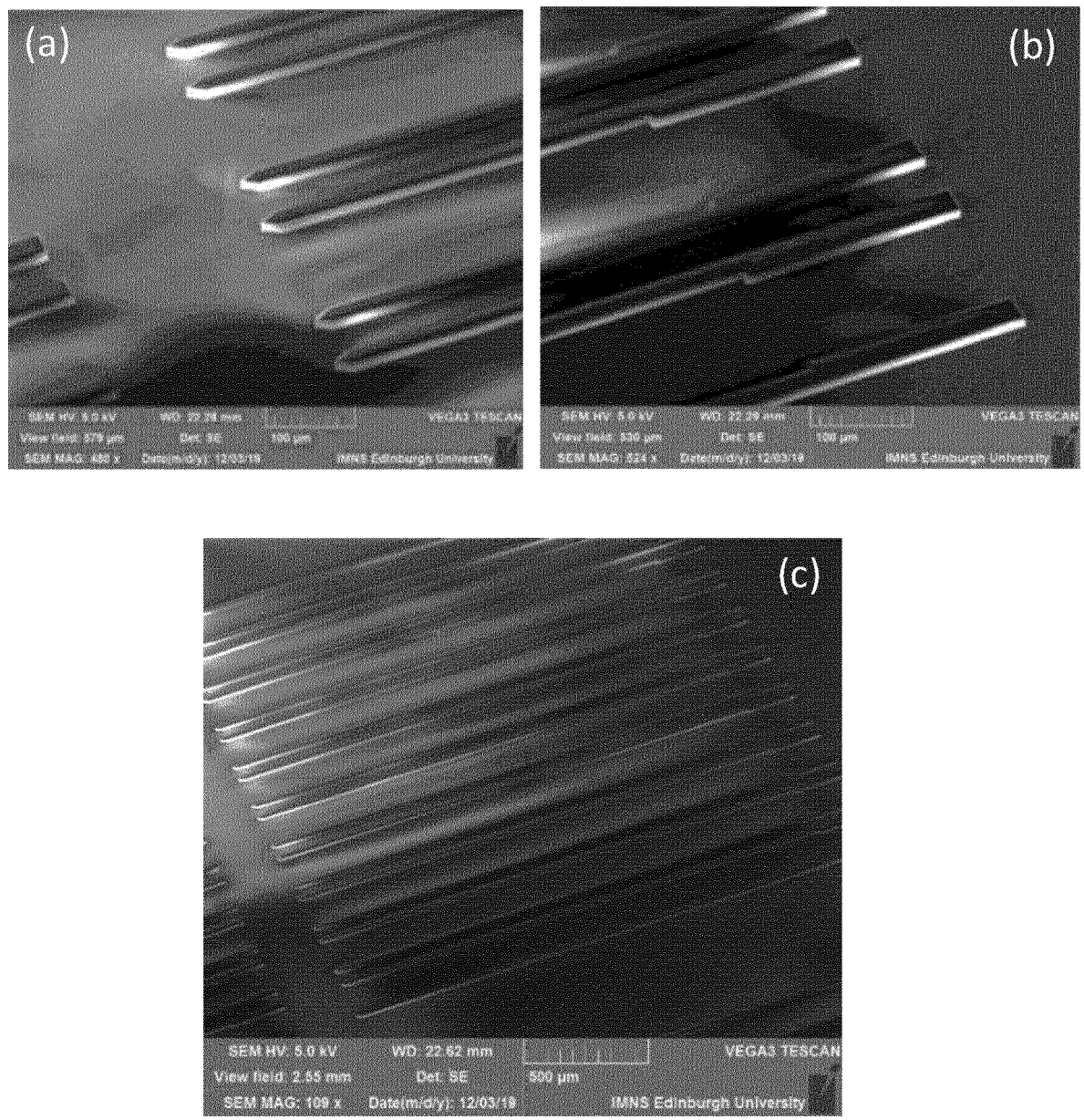
FIG. 2 shows various scanning electron microscopy images of a first example of a plurality microprobes according to the present invention.
Figure 3:
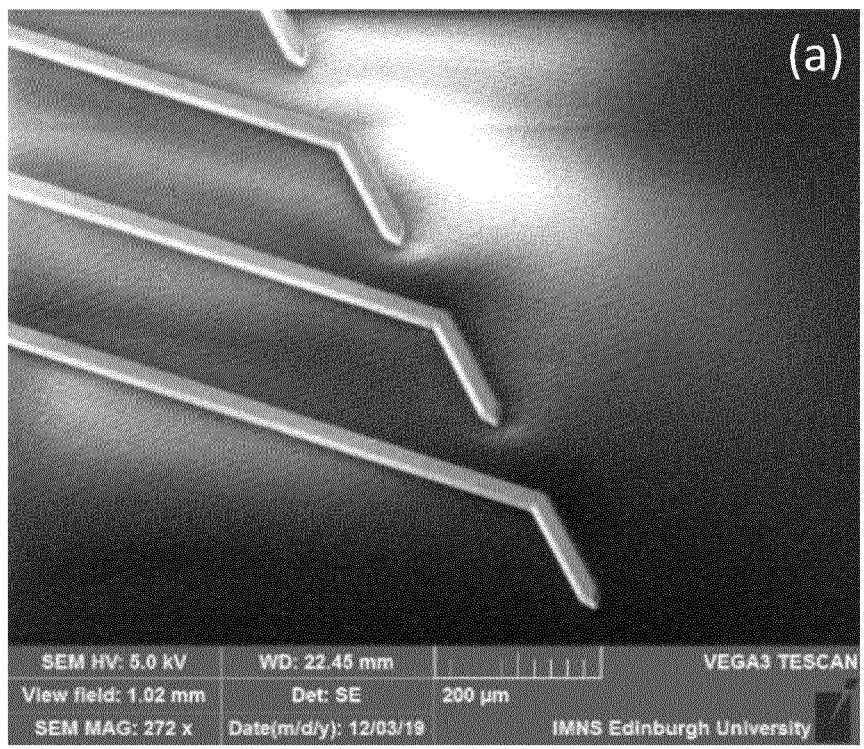
FIG. 3 shows various scanning electron microscopy images of a second example of a plurality microprobes according to the present invention.
Figure 3:
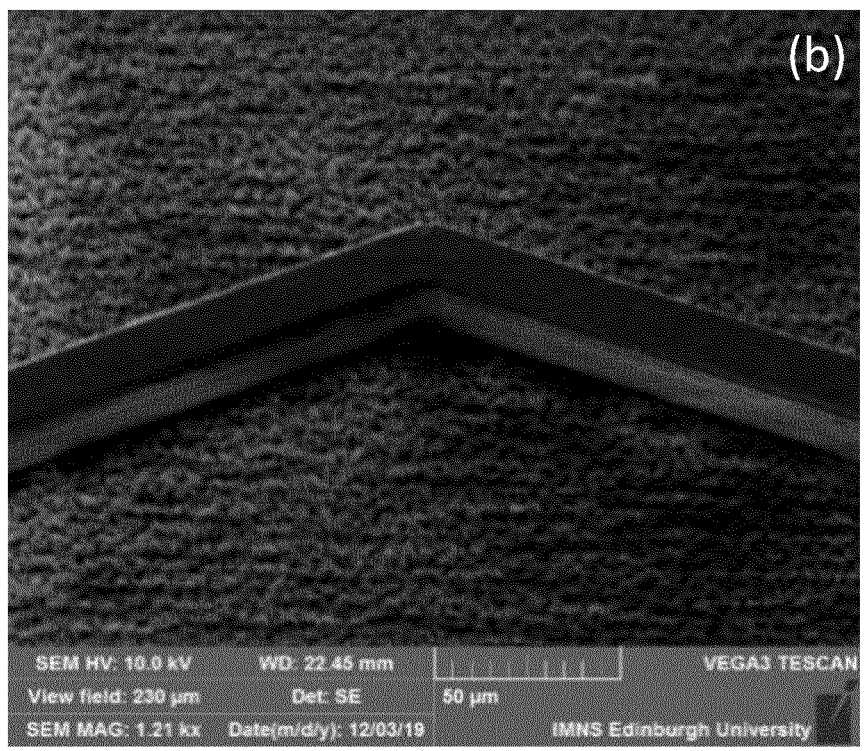

FIG. 2 and FIG. 3 show various scanning electron microscopy images of microprobes produced according to the present invention. All of the microprobes shown have the same thickness of 22 um.

FIG. 2 shows 2 mm long probes that are 25 μm wide arranged at a 50 μm separation. The microprobes have a wider section at the top which is 40 μm wide and 200 μm long.

FIG. 3 shows 4 mm long probes with a 25 μm width, arranged with a pitch of 225 μm between the parallel parts of the probes. The probe has two bends, the first shown in FIG. 3 (a) while the zoom of the other bend is shown in 3 (b). It can be seen from FIG. 3(b) that the probe sidewalls are substantially vertical and substantially smooth (with minimal or no scalloping observed).

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example+/−10%.

REFERENCES

A number of publications are cited above in order to more fully describe and disclose the invention and the state of the art to which the invention pertains. Full citations for these references are provided below.

The entirety of each of these references is incorporated herein.
1. Ma, Shenglin & Xia, Yanming & Wang, Yaohua & Ren, Kuili & Luo, Rongfeng & Song, Lu & Chen, Xian & Chen, Jing & Jin, Yufeng. (2016). "Fabrication and characterization of a tungsten microneedle array based on deep reactive ion etching technology". Journal of Vacuum Science & Technology B, Nanotechnology and Microelectronics: Materials, Processing, Measurement, and Phenomena. 34. 052002. 10.1116/1.4960715.
2. "Study of the conditions for aniostropic plasma etching of tungsten and tungsten nitride using Sf6/Ar gas mixtures". C. Reyes-Betanzo et al. Journal of the electrochemical society, 149 (3) G179-G183 (2002)
3. "Microfabrication of thick tungsten films for use as absorbers of deep x-ray lithography masks". H. Okuyama et al. Microsystems technologies 7 (2001) 80-84
4. "High Temperature—Resistant Spin-On Adhesive for Temporary Wafer Mounting Using an Automated High-Throughput Tooling Solution" A. Smith et al., CS MAN-TECH Conference, May 14-17, 2007, Austin, Texas, USA
5. U.S. Pat. No. 9,029,238 B2 "Advanced Handler wafer bonding and debonding"

The invention claimed is:
1. A method of fabrication of one or more free-standing micromachined parts comprising steps of:
   providing a tungsten-based layer supported on a carrier substrate;
   applying a photoresist, exposing the photoresist to light via a mask having a predetermined shape, and removing a portion of the photoresist to thereby provide a photoresist mask on or above the tungsten-based layer;
   performing reactive ion etching of the photoresist and tungsten-based layers to thereby define one or more micromachined parts; and
   separating the one or more micromachined parts from the carrier substrate.
2. The method according to claim 1 wherein the tungsten-based layer comprises tungsten at an atomic % of 50 at % or more.
3. The method according to claim 1 wherein tungsten-based layer is a W—Re alloy.
4. The method according to claim 1 wherein the tungsten-based layer is provided as a foil layer.
5. The method according to claim 1 wherein the method comprises a step of polishing the tungsten-based layer.
6. The method according to claim 5 wherein one or both faces of the tungsten-based layer are polished to an average surface roughness of $R_a$ of 5 nm or less, and/or $R_t$ of 50 nm or less.
7. The method according to claim 1 wherein the tungsten-based layer has a thickness of 10 µm or more prior to the step of performing reactive ion etching of the photoresist and tungsten-based layers.
8. The method according to claim 1 wherein the carrier substrate comprises a material having a thermal expansion coefficient, CTE, which is within a range of ±10% of the CTE of the tungsten-based layer.
9. The method according to claim 1 wherein the tungsten-based layer is bonded to the carrier substrate using an adhesive having a thermal expansion coefficient, CTE, which is within a range of ±10% of the CTE of the tungsten-based layer.
10. The method according to claim 1 wherein:
   (i) the photoresist is a positive photoresist, and the predetermined shape of the mask substantially corresponds to the intended shape of the one or more free-standing micromachined parts; or
   (ii) the photoresist is a negative photoresist, and the predetermined shape of the mask substantially corresponds to a negative image of the intended shape of one or more free-standing micromachined parts.
11. The method according to claim 1 wherein the reactive ion etching is performing using sulphur hexafluoride, $SF_6$, plasma.
12. The method according to claim 1 wherein the reactive ion etching uses a Bosch processes with alternative etch and passivation steps of 3.5s and 0.01s respectively.
13. The method according to claim 1 wherein the reactive ion etching is performed at a temperature of greater than 17.1° C.
14. The method according to claim 1 wherein the step of separating the one or more micromachined parts from the carrier substrate includes sub-steps of:
   bonding a free surface of the one or more micromachined parts to a releasable tape;
   separating the micromachined parts from the carrier substrate; and
   releasing the micromachined parts from the releasable tape to provide the free-standing micromachined parts.

15. The method accord to claim 14 wherein the releasable tape is a UV-release dicing tape and the step of releasing the micromachined parts from the releasable tape includes exposing the tape to UV light.

16. The method accord to claim 1 wherein the one or more free-standing micromachined parts are microprobes suitable for use in integrated circuit (IC) testing.

17. A tungsten-based microprobe obtainable by the method of claim 1, wherein the microprobe has a substantially square or rectangular cross-section, in a direction perpendicular to a longitudinal axis of the microprobe.

18. The tungsten-based microprobe according to claim 17 wherein at least one surface of the microprobe has a surface arithmetic average roughness, $R_a$, of 5 nm or less.

19. The tungsten-based microprobe according to claim 17, wherein the microprobe has a width of between 5 μm and 25 μm.

20. A probe card comprising a plurality of tungsten-based microprobes according to claim 17, wherein the pitch of the plurality of microprobes is 45 μm or less, the pitch being defined as the distance between centres of two adjacent microprobes in a direction perpendicular to a longitudinal axis of the microprobe.

* * * * *